(12) United States Patent
Yang et al.

(10) Patent No.: US 7,812,431 B2
(45) Date of Patent: Oct. 12, 2010

(54) LEADFRAME WITH DIE PAD AND LEADS CORRESPONDING THERETO

(75) Inventors: Su-Tai Yang, Kaohsiung (TW); Kuang-Chun Chou, Kaohsiung (TW); Wen-Chi Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 61 days.

(21) Appl. No.: 12/133,443

(22) Filed: Jun. 5, 2008

(65) Prior Publication Data
US 2008/0303128 A1 Dec. 11, 2008

(30) Foreign Application Priority Data
Jun. 6, 2007 (TW) .............................. 96120368 A

(51) Int. Cl.
*H01L 23/495* (2006.01)
*H01L 23/49* (2006.01)

(52) U.S. Cl. .............. 257/676; 257/E23.037; 257/E23.043; 257/E23.051; 257/E23.04; 257/E23.124; 257/E23.024; 257/E23.052; 257/666; 257/668; 257/696; 257/691; 257/690; 257/698; 257/667; 257/783; 257/678; 257/670; 257/692

(58) Field of Classification Search .......... 257/E23.037, 257/E23.043, E23.051, 666, 676, 668, 696, 257/691, 690, 698, 667, 783, E23.04, E23.124, 257/678, 670, 692, E23.024, E23.052
See application file for complete search history.

(56) References Cited

U.S. PATENT DOCUMENTS

| | | | | | |
|---|---|---|---|---|---|
| 5,519,576 | A | * | 5/1996 | Moore | 361/723 |
| 5,532,905 | A | * | 7/1996 | Moore | 361/723 |
| 5,973,407 | A | * | 10/1999 | Tzu et al. | 257/796 |
| 6,661,083 | B2 | * | 12/2003 | Lee et al. | 257/676 |
| 6,995,459 | B2 | * | 2/2006 | Lee et al. | 257/676 |
| 2002/0163015 | A1 | * | 11/2002 | Lee et al. | 257/200 |
| 2004/0080025 | A1 | * | 4/2004 | Kasahara et al. | 257/666 |
| 2007/0210422 | A1 | * | 9/2007 | Chow et al. | 257/666 |
| 2008/0142936 | A1 | * | 6/2008 | Yilmaz et al. | 257/673 |
| 2009/0014851 | A1 | * | 1/2009 | Choi et al. | 257/676 |
| 2009/0152691 | A1 | * | 6/2009 | Nguyen et al. | 257/667 |

* cited by examiner

*Primary Examiner*—Alexander O Williams
(74) *Attorney, Agent, or Firm*—Volentine & Whitt, P.L.L.C.

(57) ABSTRACT

A leadframe includes a die pad and a plurality of leads corresponding to the die pad. The die pad for supporting a die is formed with a plurality of sides, each of the sides having at least one recess portion and at least one protrusion portion. The leads are substantially coplanar to the die pad. The leads include a plurality of first leads and a plurality of second leads. The first leads extend into the recess portions respectively, and the second leads are aligned with the protrusion portions. The length of the first leads is greater than that of the second leads. The length of wires electrically connecting the die to the leads or the die pad can be adjusted by the sides of the leadframe with the recess portion and the protrusion portion having a dimension corresponding to the leads, so as to save the manufacture cost of the leadframe.

17 Claims, 2 Drawing Sheets

LEADFRAME WITH DIE PAD AND LEADS CORRESPONDING THERETO

BACKGROUND OF THE INVENTION

1. Field of the Invention

The present invention relates to a leadframe, and in particular, to a leadframe with a die pad and leads corresponding thereto.

2. Description of the Related Art

Referring to FIG. 1, the conventional leadframe 10 includes a die pad 11, two annular regions 12, 13, and a plurality of leads 14, 15. The die pad 11 is used for supporting a die. The two annular regions 12, 13 are used for providing a power source or grounding. The leads 14, 15 disposed on the periphery of the die pad 11 or the annular regions 12, 13 are electrically connected to the die (not shown).

Further, the die pad 11 has four sides and four corners. Each pair of opposite sides is aligned, and each corner extends outwardly to form a connection portion 16 so as to connect to the leadframe 10. Moreover, each connection portion 16 has several bends at the corner connected to the die pad 11 and then extends outwardly. In addition, as each pair of opposite sides of the die pad 11 is aligned, the leads 14, 15 corresponding to the sides of the die pad 11 generally have the same length. Thus, during the wire bonding of the conventional leadframe 10, the length of wires connecting the die to the leads correspondingly disposed on the sides of the die pad 11 cannot be adjusted. That is to say, the wires have a consistent length, and the consumption of the wires cannot be reduced.

Therefore, a leadframe is required to solve the above problem.

SUMMARY OF THE INVENTION

Accordingly, the present invention is directed to a leadframe with a die pad and a plurality of leads corresponding thereto. The die pad for supporting a die is formed with a plurality of sides, each of the sides having at least one recess portion and at least one protrusion portion. The leads are substantially coplanar to the die pad. The leads include a plurality of first leads and a plurality of second leads. The first leads extend into the recess portions, and the second leads are aligned with the protrusion portions. The length of the first leads is greater than that of the second leads.

The length of wires electrically connecting the die to the leads or the die pad can be adjusted by the sides of the leadframe with the recess portion and the protrusion portion having a dimension corresponding to the leads, thereby saving the manufacturing cost of the leadframe.

DETAILED DESCRIPTION OF THE INVENTION

Figure 1:
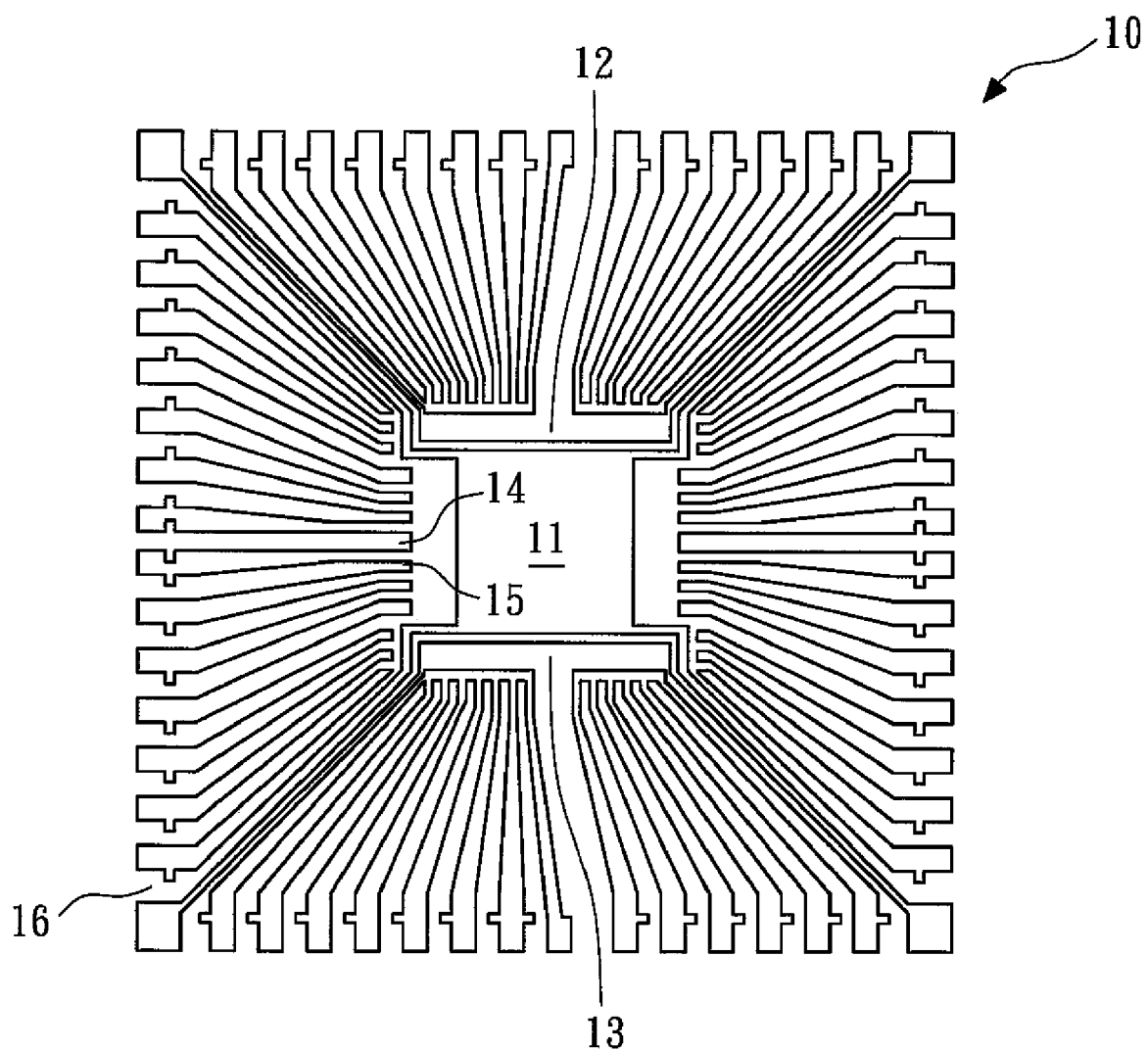
FIG. 1 is a schematic view of a conventional leadframe.
Figure 2:
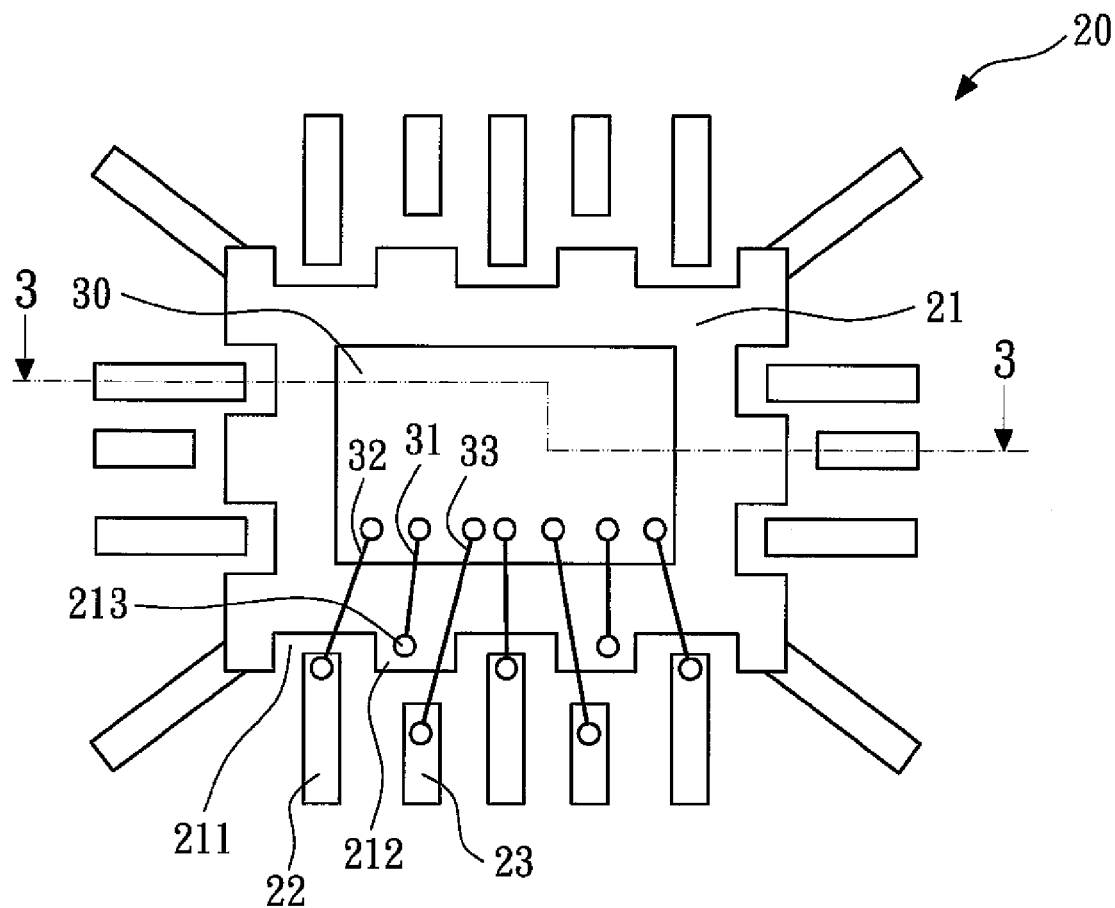
FIG. 2 is a schematic view of a leadframe of the present invention.

FIG. 2 is a schematic view of a leadframe of the present invention. Referring to FIG. 2, the leadframe 20 of the present invention includes a die pad 21 and a plurality of leads 22, 23 corresponding thereto. The die pad 21 for supporting a die 30 is formed with a plurality of sides. In this embodiment, the die pad 21 has four sides, each of the sides having at least one recess portion 211 and at least one protrusion portion 212.

The leads 22, 23 include a plurality of first leads 22 and a plurality of second leads 23. The first leads 22 extend into the recess portions 211, and the second leads 23 are aligned with the protrusion portions 212. The length of the first leads 22 is greater than that of the second leads 23. In this embodiment, the recess portions 211 and the protrusion portions 212 are arranged alternately, each of the first leads 22 extends into one recess portion 211, and each of the second leads 23 is aligned with a protrusion portion 212. In other embodiments, the plurality of first leads may extend into a recess portion, and the plurality of second leads may be aligned with a protrusion portion.

In this embodiment, each protrusion portion 211 has a contact region 213 that is electrically connected to the die 30 by a first wire 31. The contact region 213 is used to ground the die 30. The first leads 22 are electrically connected to the die 30 by a plurality of second wires 32, and the second leads 23 are electrically connected to the die 30 by a plurality of third wires 33. The length of the third wires 33 is greater than that of the is first wires 31, and the length of the third wires 33 is greater than that of the second wires 32.

The length of wires electrically connecting the die to the leads or the die pad can be adjusted by the sides of the leadframe 20 with the recess portion 211 and the protrusion portion 212 having a dimension corresponding to the leads 22, 23, thereby saving the manufacturing cost of the leadframe.

Figure 3:
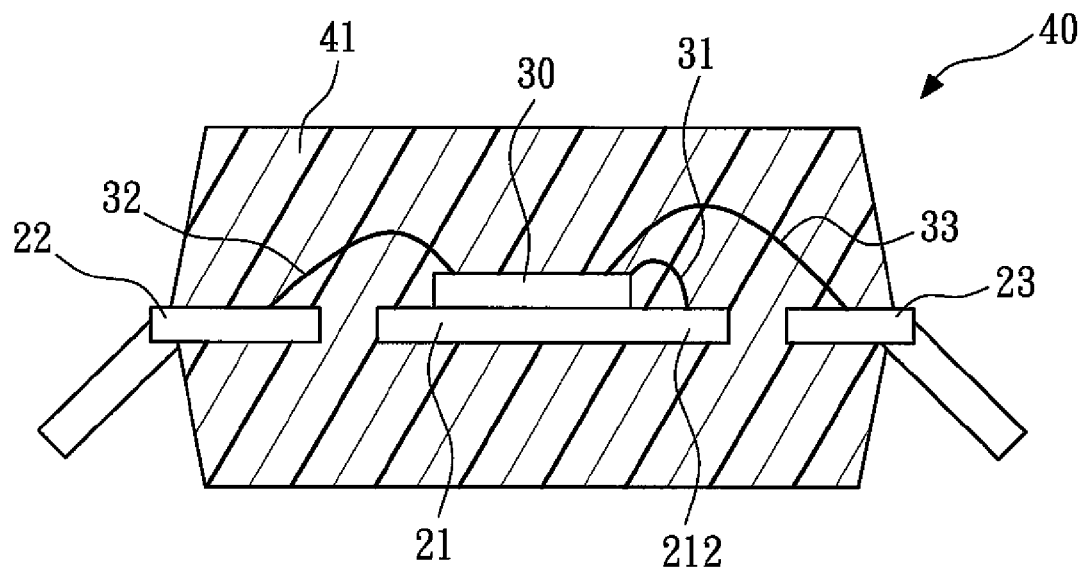
FIG. 3 is a schematic view of a package with a leadframe taken along section line 3-3 in FIG. 2 according to the present invention.

FIG. 3 is a schematic view of a package with a leadframe taken along section line 3-3 in FIG. 2 according to the present invention. Referring to FIGS. 2 and 3, the package 40 of the present invention includes a leadframe 20, a die 30, a plurality of wires 31, 32, 33, and a molding compound 41. The leadframe 20 further includes a die pad 21 and a plurality of leads 22, 23. The die pad 21 for supporting a die 30 is formed with a plurality of sides. In this embodiment, the die pad 21 has four sides, each having at least one recess portion 211 and at least one protrusion portion 212. Further, in this embodiment, the leads 23 of the leadframe 20 are substantially coplanar to the die pad 21.

Referring to FIGS. 2 and 3, the wires 31, 32, 33 are divided into a plurality of first wires 31, a plurality of second wires 32, and a plurality of third wires 33. The first wires 31 electrically connect the contact region 213 of the protrusion portion 211 and the die 30. The second wires 32 electrically connect the first leads 22 and the die 30. The third wires 33 electrically connect the second leads 23 and the die 30. The length of the third wires 33 is greater than that of the first wires 31, and the length of the third wires 33 is greater than that of the second wires 32.

Therefore, the length of wires electrically connecting the die to the leads or the die pad can be adjusted by the sides of the package 40 with the recess portion 211 and the protrusion portion 212 having a dimension corresponding to the leads 22, 23, thereby saving the packaging cost.

While the embodiment of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A leadframe with a die pad and leads corresponding thereto, comprising:
    a die pad, for supporting a die and formed with a plurality of sides, each of the sides having at least one recess portion and at least one protrusion portion; and
    a plurality of leads, substantially coplanar to the die pad, and having a plurality of first leads and a plurality of second leads, wherein the first leads extend into the recess portions, the second leads are aligned with the protrusion portions, and a length of the first leads is greater than that of the second leads,
    wherein each of the protrusion portions has a contact region that is electrically connected to the die by a first wire.

2. The leadframe according to claim 1, wherein the recess portions and the protrusion portions are arranged alternately.

3. The leadframe according to claim 1, wherein each of the first leads extends into a recess portion.

4. The leadframe according to claim 1, wherein the plurality of first leads extend into a recess portion.

5. The leadframe according to claim 1, wherein each of the second leads is aligned with a protrusion portion.

6. The leadframe according to claim 1, wherein the plurality of second leads are aligned with a protrusion portion.

7. The leadframe according to claim 1, wherein the contact region is used for grounding the die.

8. The leadframe according to claim 1, wherein the first leads are electrically connected to the die by a plurality of second wires, the second leads are electrically connected to the die by a plurality of third wires, and a length of the third wires is greater than that of the second wires.

9. A package with a leadframe, comprising:
    a leadframe with a die pad and leads corresponding thereto, comprising:
        a die pad, formed with a plurality of sides, each of the sides having at least one recess portion and at least one protrusion portion; and
        a plurality of leads, substantially coplanar to the die pad, and having a plurality of first leads and a plurality of second leads, wherein the first leads extend into the recess portions, the second leads are aligned with the protrusion portions, and a length of the first leads is greater than that of the second leads;
    a die, disposed on the die pad; and
    a plurality of wires, comprising a plurality of first wires, a plurality of second wires, and a plurality of third wires, wherein the first wires electrically connect the protrusion portions and the die, the second wires electrically connect the first leads and the die, and the third wires electrically connect the second leads and the die.

10. The package according to claim 9, wherein the recess portions and the protrusion portions are arranged alternately.

11. The package according to claim 9, wherein each of the first leads extends into a recess portion.

12. The package according to claim 9, wherein the plurality of first leads extend into a recess portion.

13. The package according to claim 9, wherein each of the second leads is aligned with a protrusion portion.

14. The package according to claim 9, wherein the plurality of second leads are aligned with a protrusion portion.

15. The package according to claim 9, wherein each of the protrusion portions has a contact region that is electrically connected to the die by the first wires.

16. The package according to claim 9, wherein the contact region is used for grounding the die.

17. The package according to claim 9, wherein a length of the third wires is greater than that of the first wires, and a length of the third wires is greater than that of the second wires.

* * * * *